(12) United States Patent
Miya et al.

(10) Patent No.: US 7,365,274 B2
(45) Date of Patent: Apr. 29, 2008

(54) ELECTRONIC CIRCUIT BOARD

(75) Inventors: Tatsuya Miya, Kanagawa (JP); Kazuharu Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/322,306

(22) Filed: Jan. 3, 2006

(65) Prior Publication Data

US 2006/0162958 A1    Jul. 27, 2006

(30) Foreign Application Priority Data

Jan. 26, 2005   (JP)   ............................. 2005-018006

(51) Int. Cl.
*H05K 1/16* (2006.01)
(52) U.S. Cl. .................. 174/260; 174/255; 174/261
(58) Field of Classification Search ................ 174/260; 361/760
See application file for complete search history.

(56) References Cited

U.S. PATENT DOCUMENTS

| | | | |
|---|---|---|---|
| 5,369,880 A * | 12/1994 | Gundotra et al. | ............. 29/840 |
| 5,759,047 A * | 6/1998 | Brodsky et al. | ............... 439/66 |
| 6,362,435 B1 * | 3/2002 | Downey et al. | ............. 174/260 |
| 6,362,436 B1 * | 3/2002 | Kimbara et al. | ............. 174/260 |
| 6,399,896 B1 * | 6/2002 | Downes et al. | ............. 174/260 |
| 6,566,611 B2 * | 5/2003 | Kochanowski et al. | ..... 174/261 |
| 6,573,610 B1 * | 6/2003 | Tsai | ........................... 257/780 |
| 6,700,204 B2 * | 3/2004 | Huang et al. | ............... 257/774 |
| 6,871,392 B2 * | 3/2005 | Tsuchiya et al. | ......... 29/603.03 |

FOREIGN PATENT DOCUMENTS

| | | |
|---|---|---|
| JP | 2003-347356 | 12/2003 |
| JP | 2004-47781 | 2/2004 |

* cited by examiner

*Primary Examiner*—Ishwar (I. B.) Patel
(74) *Attorney, Agent, or Firm*—McGinn IP Law Group, PLLC

(57) ABSTRACT

A board for high frequency device includes a plurality of electrode terminals connected to an electronic component or another electronic circuit board by flowable conducting material such as solder, and grooves formed in an electrode terminal of the plurality of electrode terminals and capable of accumulating solder or the like. Specifically, a high frequency component is mounted on the front surface of the high frequency device board, and the plurality of electrode terminals are formed on the rear surface of the high frequency device board. A ground electrode terminal included in the plurality of electrode terminals is formed at the center of the rear surface of the high frequency device board and connected to a ground. The grooves for accumulating solder or the like are formed in the ground electrode terminal. This reduces the possibility of short-circuit between adjacent electrode terminals due to the flowable conducting material such as solder.

12 Claims, 4 Drawing Sheets

ELECTRONIC CIRCUIT BOARD

BACKGROUND OF THE INVENTION

1. Field of the Invention

The present invention relates to electronic circuit boards and, particularly, to an electronic circuit board having a plurality of electrode terminals connected to an electronic component or another electronic circuit board by using flowable conducting material.

2. Description of Related Art

Various recent electrical products have a semiconductor device such as a transistor and IC or an electric component such as a capacitor and filter that is surface-mounted on a packaging substrate.

Particularly in the field of small-size portable electronic equipment such as mobile phones and portable digital cameras, there has been remarkable progress in the development of lighter, thinner, shorter and smaller products. Accordingly, development of lighter, thinner, shorter and smaller electronic components to be mounted on electronic equipment is proceeding rapidly.

In smaller and highly functional electronic components, the pitch of electrode terminals formed therein is narrow. Accordingly, the pitch of electrode terminals formed on a packaging substrate where an electronic component is mounted is also narrow. Further, the distance between electronic components is short due to high density packaging of electronic components on a packaging substrate.

As a reference technique, Japanese Unexamined Patent Publication No. 2004-47781 discloses a board where four slit grooves are formed in a pad on the board. The four slit grooves extend from the center of the pad to open toward the middle of four sides of the pad. When a circuit element is mounted on the pad of the board, flux contained in solder is collected in the four slit grooves, thereby preventing generation of a flux collective portion between the circuit element and the pad.

As another reference technique, Japanese Unexamined Patent Publication No. 2003-347356 discloses a technique that includes a plurality of pads formed on the rear surface of a semiconductor chip, grooves formed in the periphery of the plurality of pads, and grooves extending from a part of the periphery of the pad to the peripheral end of the semiconductor chip in such a way that they open outward at the peripheral end. When the semiconductor chip is mounted to a packaging substrate, excess of molten solder runs into the grooves formed on the rear surface of the semiconductor chip, thereby producing a thinner semiconductor device.

Narrow pitch of electrode terminals formed on a board on which an electronic component is to be mounted and small interval between electrode components in small, highly functional, and high density packaging electronic components cause short-circuit between adjacent electrode terminals to occur when surface-mounting the electronic component onto the board due to flowable conducting material such as solder.

Short-circuit between electrode terminals is likely to occur particularly when surface-mounting a high frequency device having high frequency characteristics onto a packaging substrate. This is described hereinafter in detail.

The high frequency device is produced by mounting a plurality of high frequency electronic components on the surface of a board for high frequency device and packaging those high frequency electronic components with resin, for example. Further, a plurality of electrode terminals are formed on the rear surface of the board for high frequency device, and those electrode terminals are connected to electrode terminals on the packaging substrate by flowable conducting material such as solder.

The high frequency device is composed of high frequency electronic components such as a semiconductor chip, transistor, IC, diode, chip capacitor, chip resistor, surface acoustic wave (SAW) filter, and inductor, a module that combines these components, and so on. The semiconductor chip, transistor, IC and diode form a semiconductor device. The chip capacitor, chip resistor, SAW filter and inductor form a passive circuit device.

The high frequency wave refers to communication wave, microwave, submillimeter wave, millimeter wave and so on that are used in various mobile communication, satellite broadcasting and wireless LAN (WLAN).

In order for the high frequency device to have high frequency characteristics, it is necessary to place a ground electrode terminal on substantially the whole area of the rear surface of the high frequency device board from its center part to peripheral part. A plurality of high frequency electronic components and so on are mounted on the surface of the high frequency device board.

This structure minimizes the connection between the ground electrode terminal of the high frequency electronic component that is formed on the front surface of the high frequency device board and the ground electrode terminal of the high frequency device board that is formed on the rear surface of the high frequency device board to minimize reactance component, thereby maintaining high frequency characteristics of high frequency electronic components.

Further, the ground electrode terminal on the rear surface of the high frequency device board is formed in a wide range so as to include the area immediately below a strip line path that is formed on the front surface of the high frequency device board. This prevents a change in characteristics impedance of the strip line path, thereby maintaining high frequency characteristics of high frequency electronic components.

It is particularly effective to form the ground electrode terminal on the rear surface of the high frequency device board in a wide range so as to include the area immediately below a strip line path that is formed on the front surface of the high frequency device board if a high frequency device includes a distributed constant circuit.

In addition, since the high frequency electronic components are placed at the end part of the high frequency device, if the strip line path needs to be drawn to the end of the high frequency device board, it is necessary to form the ground electrode terminal on the rear surface of the high frequency device board in a still wider range from the center to the peripheral part of the high frequency device board.

As described above, in order for the high frequency device to have high frequency characteristics, it is necessary to place the ground electrode terminal on substantially the whole area of the rear surface of the high frequency device board from its center part to near end part.

The distance between a ground electrode terminal and an electrode terminal adjacent to the ground electrode terminal is thereby narrowed. This causes solder bridge to occur when surface-mounting the high frequency device onto an electronic circuit board. Short-circuit between electrode terminals is thus likely to occur.

The narrow pitch of electrode terminals formed on a board on which electronic components are to be mounted in small, highly functional, and high density packaging electronic components causes short-circuit between adjacent electrode terminals due to flowable conducting material such as solder. Further, the small distance between electrode components also causes short-circuit between adjacent electrode terminals to occur when surface-mounting electronic components onto the board due to flowable conducting material such as solder.

SUMMARY OF THE INVENTION

According to an aspect of the present invention, there is provided an electronic circuit board that includes a plurality of electrode terminals connected to an electronic component or another electronic circuit board by using flowable conducting material and a groove formed in an electrode terminal of the plurality of electrode terminals to accumulate the flowable material.

Since this structure has the groove for accumulating flowable material in the electronic terminal, it is possible to prevent short-circuit between adjacent electrode terminals due to flowable conducting material such as solder.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

The structure of a board for high frequency device, which is referred to herein also as the high frequency device board, is described below with reference to the drawings.

Figure 1:
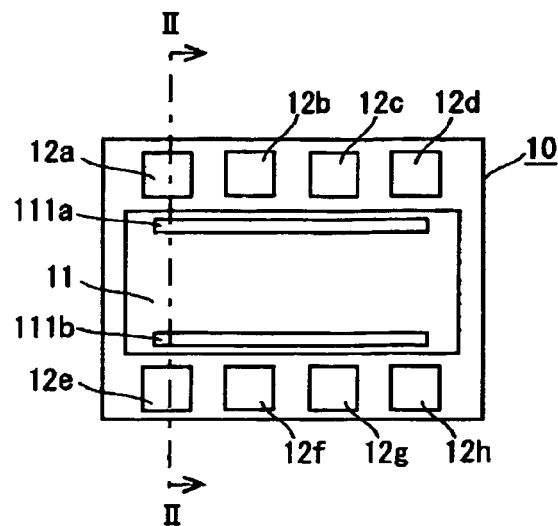
FIG. 1 is a view showing the rear surface of a board for high frequency device according to a first embodiment of the present invention.

FIG. 1 shows the rear surface of the high frequency device board according to a first embodiment of the present invention.

In FIG. 1, a high frequency electronic component (not shown) is formed on the front surface of the high frequency device board 10 as an electronic circuit board.

On the rear surface of the high frequency device board 10, a plurality of electrode terminals 11, 12a to 12h are formed. The electrode terminals 11, 12a to 12h are connected to another electronic circuit board (not shown) by using solder that is flowable conducting material.

A ground electrode terminal 11 that is included in the plurality of electrode terminals is connected to a ground and formed widely from the center to the peripheral part of the rear surface of the high frequency device board 1.

The ground electrode terminal 11 has grooves 111a and 111b for accumulating solder. The grooves 111a and 111b have a slit shape, surrounded by a bottom surface and four side surfaces. The grooves 111a and 111b are not connected to the outside of the ground electrode terminal 11. However, if no electrode terminal exists in the vicinity of a connecting portion, the grooves 111a and 111b may be connected to the outside of the ground electrode terminal 11.

The high frequency device board 10 is a copper-clad double-sided board. The grooves 111a and 111b are formed by removing copper by etching. The bottom surfaces of the grooves 111a and 111b are preferably formed of insulating material. Further, the grooves 111a and 111b are placed in the ground electrode terminal 11 in near proximity to functional electrode terminals 12a to 12h that are adjacent to each other. The functional electrode terminals 12a to 12h include an electrode terminal for signal input and output, an electrode terminal for power supply and so on.

The functional electrode terminals 12a to 12h are aligned along both ends of the rear surface of the high frequency device board 10 as shown in FIG. 1.

On the front surface of the high frequency device board 10, a high frequency electronic component, which is not shown, is mounted as described later with reference to FIG. 2.

An example of mounting of a high frequency device is described below.

Figure 2:
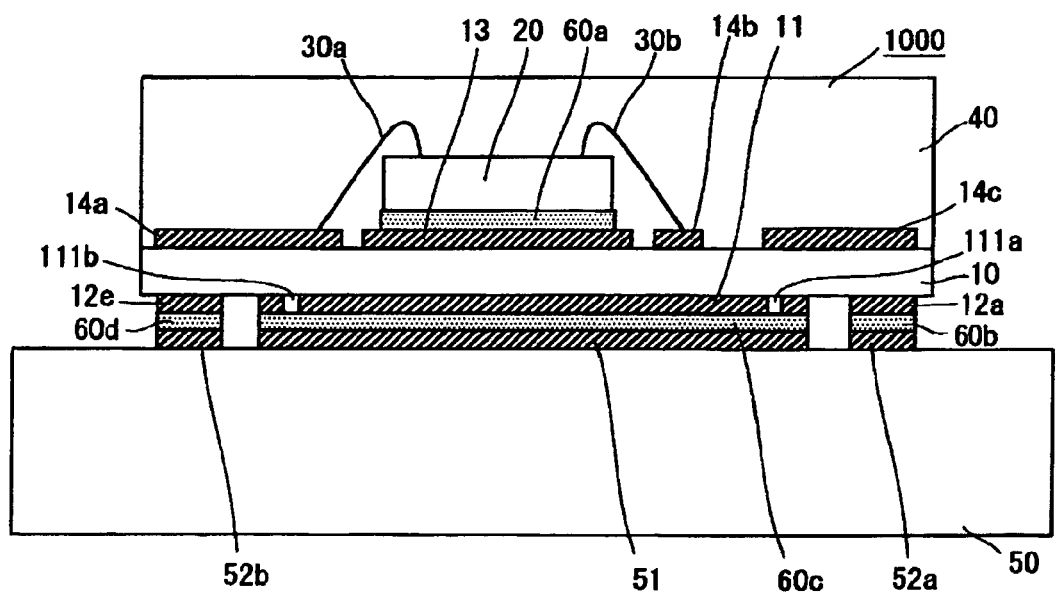
FIG. 2 is a schematic cross-sectional view showing an example of mounting of a high frequency device.

FIG. 2 is a schematic cross-sectional view showing mounting example of a high frequency device.

The high frequency device board 10 shown in FIG. 2 is a cross-section along line II-II in FIG. 1.

A high frequency device 1000 includes the high frequency device board 10 and a semiconductor chip 20 that is mounted above the surface of the high frequency device board 10. The semiconductor chip 20 is merely an example of a high frequency electronic component, and it may be replaced by a transistor, IC, diode, chip capacitor, chip resistor, SAW filter, inductor, or module combining these.

On the front surface of the high frequency device board 10, an electrode terminal (mount pad) 13 and a plurality of electrode terminals (bonding pads) 14a to 14c are formed. On the rear surface of the high frequency device board 10, the ground electrode terminal 11 is formed from the center to peripheral part, and functional electrode terminals 12a and 12e are formed in the both peripheral ends.

As shown in FIG. 2, the grooves 111a and 111b are formed inside the ground electrode terminal 11 in near proximity to the functional electrode terminals 12a and 12e.

The semiconductor chip 20 is attached onto the electrode terminal 13 on the high frequency device board 10 by solder 60a as shown in FIG. 2.

Electrode pads (not shown) formed on the surface of the semiconductor chip 20 and the electrode terminals 14a and 14b formed on the surface of the high frequency device board 10 are connected by gold wires 30a and 30b.

The semiconductor chip 20, the electrode terminals 14a to 14c and so on of the high frequency device 1000 are covered with epoxy resin 40.

On a packaging substrate 50 that is formed of glass epoxy material, for example, a plurality of electrode terminals 51, 52a, 52b and a plurality of wiring patterns (not shown) are formed by etching.

The electrode terminal 51 is formed on the packaging substrate 50 so as to correspond to the size and position of the ground electrode terminal 11 on the high frequency device board 10.

Similarly, the electrode terminals 52a and 52b are formed on the packaging substrate 50 so as to correspond to the size and position of the functional electrode terminals 12a and 12e on the high frequency device board 10.

The high frequency device 1000 is mounted on the surface of the packaging substrate 50 as shown in FIG. 2. The electrode terminals 11, 12a and 12e formed on the rear surface of the high frequency device board 10 of the high frequency device 1000 are connected to the electrode terminals 51, 52a and 52b formed on the packaging substrate 50 by solders 60b, 60c and 60d.

Since FIG. 2 shows the structure schematically, the solder 60c does not flow into the grooves 111a and 111b in the ground electrode terminal 11. In reality, however, the solder 60c flows into the grooves 111a and 111b as described later with reference to FIGS. 3A to 3D.

The process of mounting the high frequency device 1000 onto the packaging substrate 50 is described hereinafter with reference to the drawings.

FIGS. 3A to 3D are cross-sectional views to describe the process of mounting the high frequency device onto the packaging substrate.

In the following, the process that the solder 60c flows into the grooves 111a and 111b in the ground electrode terminal 11 of the high frequency device board 10 when mounting the high frequency device 1000 onto the packaging substrate 50 by the solders 60b to 60d is described herein in detail with reference to FIGS. 3A to 3D.

FIGS. 3A to 3D are enlarged views of the right half of the high frequency device 1000 and the packaging substrate 50 shown in FIG. 2. FIGS. 3A to 3D omit the illustration of the detailed structure inside the high frequency device 1000, which includes the semiconductor chip 20, the electrode terminals 13, 14a and 14b, for example.

Figure 3A:
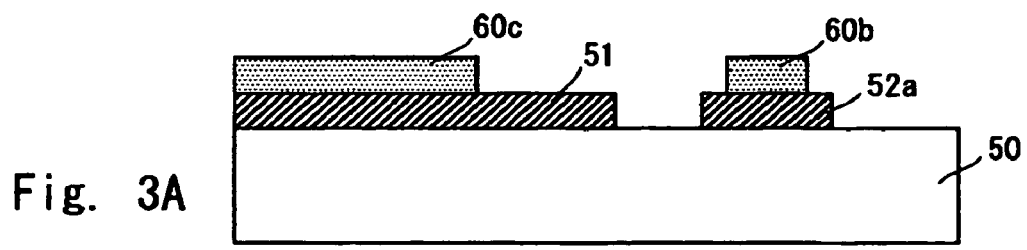
FIGS. 3A to 3D are cross-sectional views to describe the process of mounting a high frequency device onto a packaging substrate.

Firstly, as shown in FIG. 3A, creamy solders 60b and 60c are applied onto the electrode terminals 51 and 52a, respectively, that are formed on the packaging substrate 50 with masking by using a metal mask.

Figure 3B:
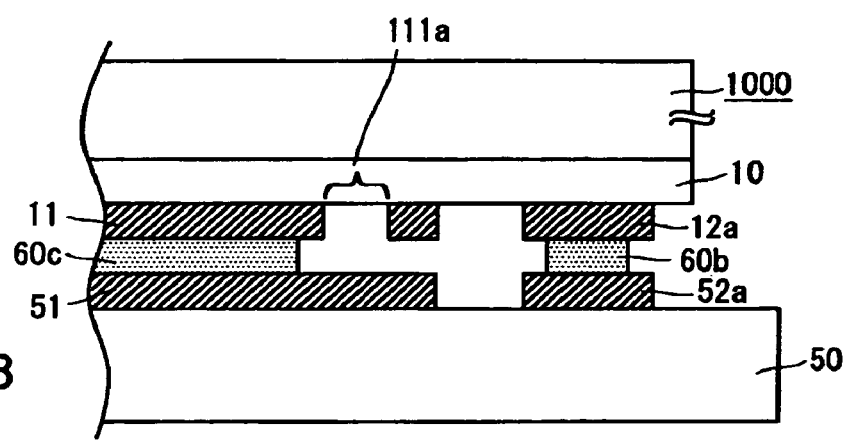

Then, as shown in FIG. 3B, the high frequency device 1000 is placed on the packaging substrate 50 so that the electrode terminals 11 and 12a of the high frequency device 1000 are placed respectively on the electrode terminals 51 and 52a of the packaging substrate 50 by using an image recognition processing, for example.

After that, heat is applied to the packaging substrate 50 by using a reflow unit (not shown), for example, thereby melting down the solders 60b and 60c.

Figure 3C:
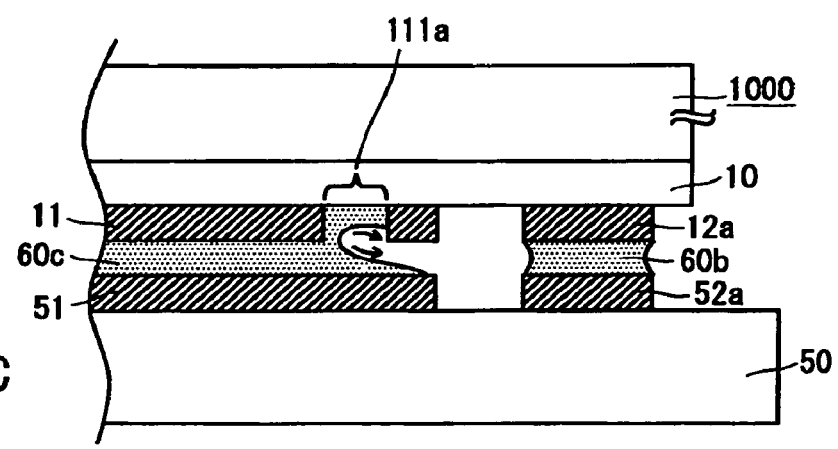

At this time, as shown in FIG. 3C, the solders 60b and 60c spread in parallel with the surface of the electrode terminals 51 and 52a of the packaging substrate 50 between the electrode terminals 11 and 12a of the high frequency device 1000 and the electrode terminals 51 and 52a of the packaging substrate 50.

As indicated by the arrow in FIG. 3C, the solder 60c is melted by heat to flow into the groove 111a that is formed in the ground electrode terminal 11. At this time, flux contained in the solder 60c first flows into the groove 111a and, following the flow of the flux, tin and lead contained in the solder 60c then flow into the groove 111a. Since the bottom surface of the groove 111a, which is the upper surface in FIG. 3C, is formed of insulating material, the solder 60c is not likely to adhere onto the bottom surface of the groove 111a. Thus, the solder 60c does not flow out by slipping against the bottom surface of the groove 111a but is gradually accumulated inside the groove 111a that is surrounded by the bottom surface and four side surfaces.

Figure 3D:
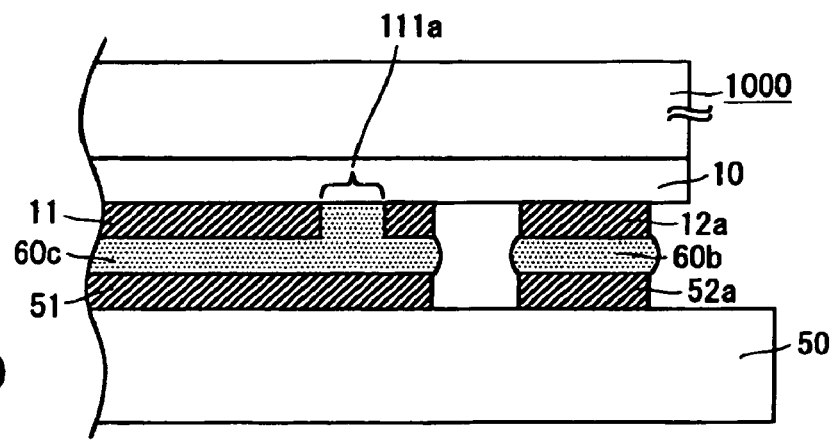

When the solder 60c is accumulated to fill the groove 111a, it further flows to the end of the ground electrode 11. Eventually, a fillet having a shape shown in FIG. 3D is formed in the peripheral part of the electrode terminals 11 and 51 of the high frequency device 1000 and the packaging substrate 50, respectively. Then, the packaging substrate 50 is cooled and thereby the high frequency device 1000 is fixed to the surface of the packaging substrate 50 by the solders 60b and 60c as shown in FIG. 3D.

Since the ground electrode terminal 11 of the high frequency device 1000 has the groove 111a for accumulating the solder 60c, it is possible to limit the solder 60c from running off the end of the electrode terminals 11 and 51 of the high frequency device 1000 and the packaging substrate 50. This reduces the possibility of short-circuit between adjacent electrode terminals due to the solder 60c.

Particularly, since the bottom surface of the groove 111a of the ground electrode terminal 11 of the high frequency device 1000 is formed of insulating material, the solder 60c is accumulated inside the groove 111a without adhering onto the bottom surface of the groove 111a. It is therefore possible to limit the solder 60c from running off the end of the electrode terminals 11 and 51 of the high frequency device 1000 and the packaging substrate 50 more effectively, thereby further reducing the possibility of short-circuit between adjacent electrode terminals due to the solder 60c.

By limiting the solder 60c from running off the end of the electrode terminals 11 and 51 of the high frequency device 1000 and the packaging substrate 50, it is possible to reduce the pitch between the electrode terminals 11 and 12a to 12g shown in FIG. 1 and to further reduce the distance between high frequency electronic components in the high frequency device 1000.

In order for the high frequency device to have high frequency characteristics, it is necessary to place the ground electrode terminal 11 widely from the center part to the peripheral part of the rear surface of the high frequency device board 10. Thus, the distance between the ground electrode terminal 11 and the functional electrode terminals 12a to 12h is narrow. However, since the ground electrode terminal 11 of the high frequency device 1000 has the grooves 111a and 111b for accumulating the solder 60c, it is possible in this case also to effectively limit the solder 60c from running off the end of the electrode terminals 11 and 51 of the high frequency device 1000 and the packaging substrate 50, thereby reducing the possibility of short-circuit between adjacent electrode terminals due to the solder 60c.

For example, it was possible to limit the solder 60c from running off the end of the electrode terminals 11 and 51 of the high frequency device 1000 when the ground electrode terminal of the high frequency device board 10 shown in FIG. 1 has an area of 4 mm$^2$, the slit grooves 111a and 111b have a width of approximately 0.1 mm and a depth of approximately 0.03 mm to 0.06 mm, and masking of solder printing is implemented by using a metal mask having a thickness of 0.08 mm.

This allowed the shortest distance between the ground electrode terminal 11 and the functional electrode terminals 12a to 12h shown in FIG. 1 to be as small as approximately 0.1 mm. In comparison, the shortest distance between the ground electrode terminal 11 and the functional electrode terminals 12a to 12h needed to be approximately 0.3 mm to 0.5 mm in order to prevent generation of solder bridge between adjacent electrode terminals in a conventional technique where the ground electrode terminal 11 does not have the grooves 111a and 111b in the structure that the ground electrode terminal has an area of 4 mm².

The above embodiment of the present invention describes that the grooves 111a and 111b for accumulating the solder 60c is formed in the ground electrode terminal 11 on the rear surface of the high frequency device board 10. However, the grooves 111a and 111b for accumulating the solder 60c may be formed in the ground electrode terminal 51 on the front surface of the packaging substrate 50 instead of in the ground electrode terminal 11 on the rear surface of the high frequency device board 10.

The structure of an alternative example of the high frequency device board according to the first embodiment of the invention is described hereinafter with reference to the drawings.

Figure 4:
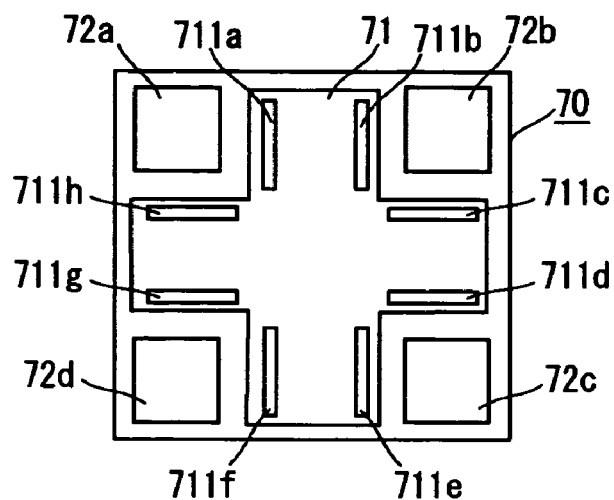
FIG. 4 is a view showing an alternative example of the rear surface of a board for high frequency device according to the first embodiment of the present invention.

FIG. 4 is a view showing the rear surface of an alternative example of the high frequency device board according to the first embodiment of the invention.

The high frequency device board of FIG. 4 is different from the high frequency device board 10 in the shape and position of electrode terminals 71 and 72a to 72d.

The ground electrode terminal 71 is connected to a ground and formed widely from the center part of the rear side surface of the high frequency device board 70 to the middle of each side of the high frequency device board 70.

The electrode terminals 72a to 72d other than the ground electrode terminal 71 are respectively placed in the four corners of the high frequency device board 70.

The ground electrode terminal 71 has grooves 711a to 711h for accumulating solder that is flowable conducting material. The grooves 711a to 711h are formed surrounded by a bottom surface and four side surfaces and slit-shaped. The high frequency device board 70 is a copper-clad double-sided board. The grooves 711a to 711h are formed by removing copper by etching. The bottom surfaces of the grooves 711a to 711h are preferably formed of insulating material.

Further, each of the grooves 711a to 711h is placed in the ground electrode terminal 71 in near proximity to the electrode terminals 72a to 72d that are adjacent to each other.

In the structure shown in FIG. 4 as well, since the ground electrode terminal 71 has grooves 711a to 711h for accumulating solder, it is possible to limit the solder from running off the end of the ground electrode terminals 71, thereby reducing the possibility of short-circuit between adjacent electrode terminals due to the solder. It is further possible to shorten the distance between electrode terminals of a high frequency electronic component, thereby reducing the entire size of the high frequency device.

Second Embodiment

A packaging substrate according to a second embodiment of the present invention is described hereinafter with reference to the drawings.

Figure 5:
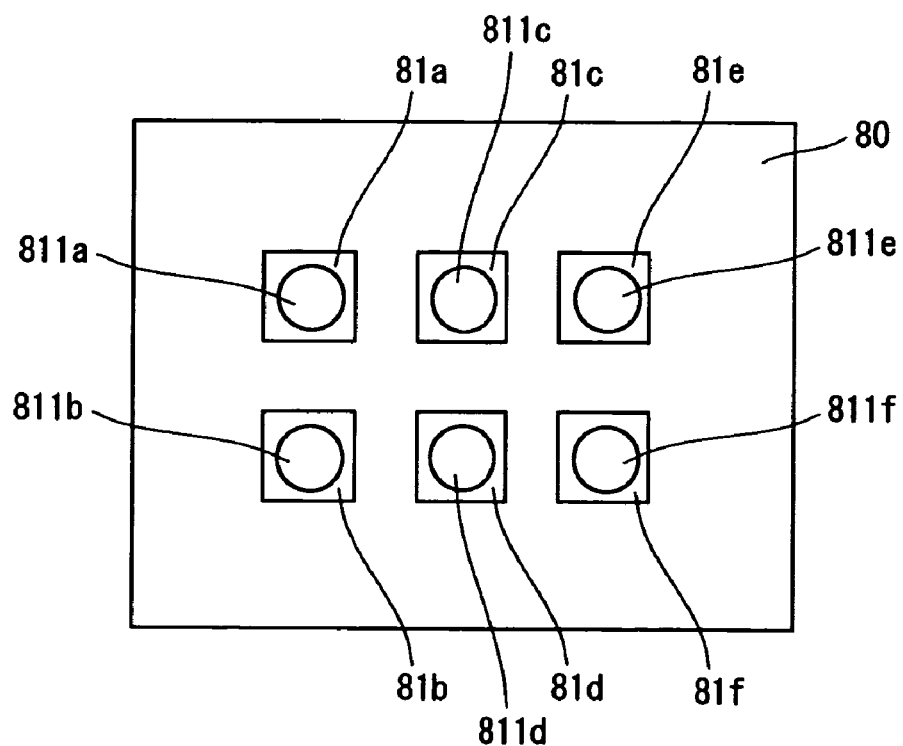
FIG. 5 is a view showing the front surface of the board for a high frequency device according to a second embodiment of the present invention.

FIG. 5 is a view showing the front surface of the packaging substrate according to the second embodiment of the invention.

Figure 6:
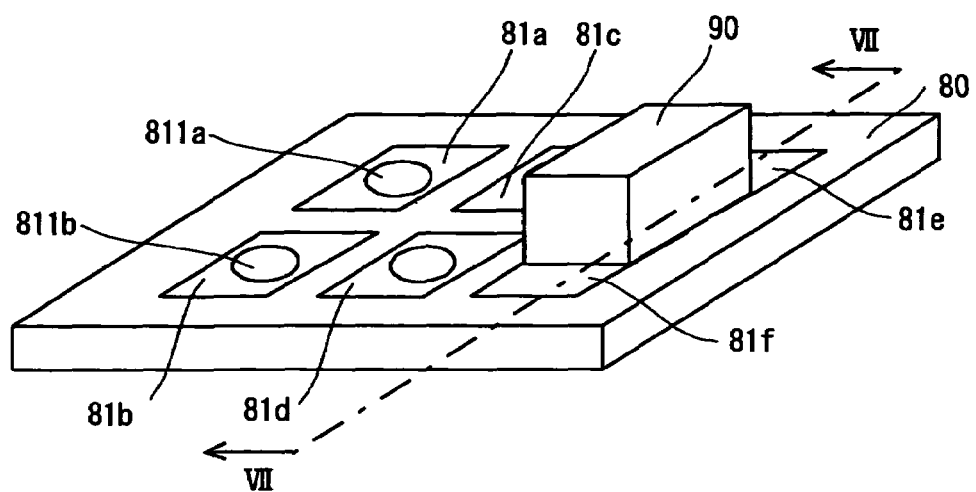
FIG. 6 is a perspective view showing an electronic component mounted on a packaging substrate according to the second embodiment of the present invention.

FIG. 6 is a perspective view in which an electronic component is mounted on a packaging substrate according to the second embodiment of the invention.

In FIG. 5, a plurality of electrode terminals 81a to 81f are formed on the surface of a packaging substrate 80 that serves as an electronic circuit board.

As shown in FIG. 6, a resistor 90 is mounted on the plurality of electrode terminals 81a to 81f. The plurality of electrode terminals 81a to 81f and the electrode terminal of the resistor 90 are connected by solder (not shown). FIG. 6 illustrates the state where the resistor 90 is connected only to the electrode terminals 81e and 81f for convenience.

As shown in FIG. 5, the packaging substrate 80 is a copper-clad double-sided board, and grooves 811a to 811f are formed by removing copper by etching. The grooves 811a to 811f are formed surrounded by a bottom surface and an inner side surface of a cylinder. When the resistor 90 is mounted, solder is accumulated inside the grooves 811a to 811f. Further, as shown in FIG. 5, the electrode terminals 81a to 81f are formed adjacent to each other.

An example of mounting that uses a packaging substrate of the second embodiment is described hereinafter.

Figure 7:
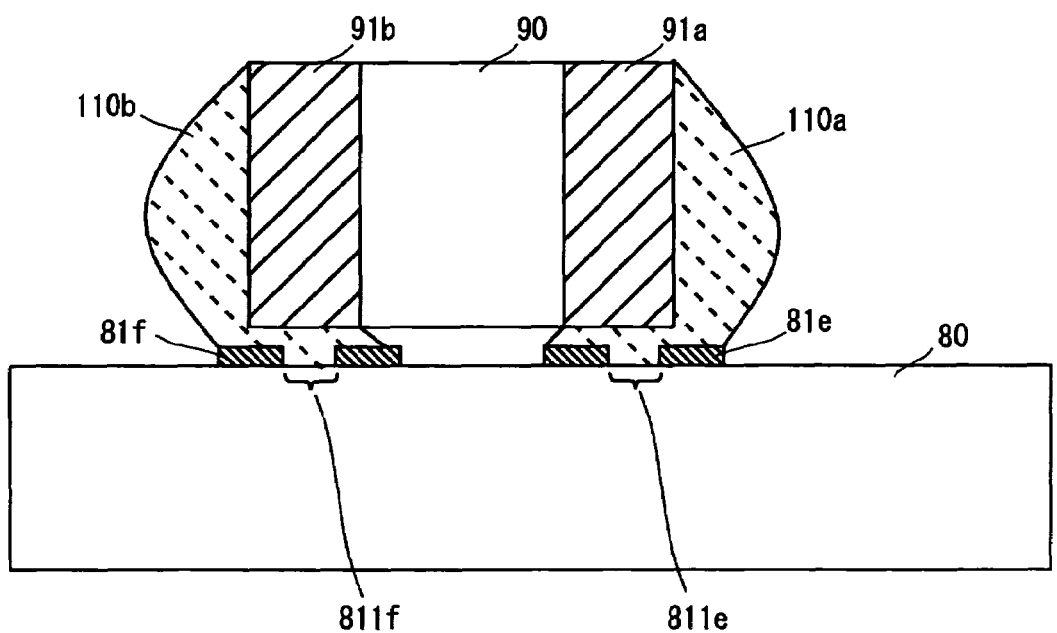
FIG. 7 is a schematic cross-sectional view showing an example that a resistor is mounted on a packaging substrate according to the second embodiment of the present invention.

FIG. 7 is a schematic cross-sectional view showing an example of mounting a resistor on a packaging substrate according to the second embodiment.

The packaging substrate 80 shown in FIG. 7 is a cross-section along line VII-VII in FIG. 6.

The electrode terminals 81a and 81f are formed on the surface of the packaging substrate 80. The surface of the packaging substrate 80 shown in FIG. 7 has the structure shown in FIG. 5.

As shown in FIG. 7, the resistor 90 is mounted on the surface of the packaging substrate 80. The electrode terminals 91a and 91b that are formed in both sides of the resistor 90 are connected to the electrode terminals 81e and 81f that are formed on the surface of the packaging substrate 80 by solders 110a and 110b.

At this time, the solders 110a and 110b flow into grooves 811e and 811f that are formed in the electrode terminals 81e and 81f.

Preferably, the bottom surfaces of the grooves 811a to 811f are not formed of insulating material. If the bottom surfaces of the grooves 811a and 811b are not formed of insulating material, the solders 110a and 110b are likely to adhere onto the bottom surfaces of the grooves 811a and 811b. As a result, the solders 110a and 110b flow into the grooves 811a and 811b by slipping against the bottom surface of the grooves 811a and 811b and thereby they are deeply accumulated inside the 811a and 811b that are surrounded by the bottom surface and the cylinder inner side surface.

As described above, since the electrode terminals 81a to 81f on the packaging substrate 80 have the grooves 811a to 811f for accumulating solder, it is possible to limit an overhanging amount of the solders 110a and 110b from the ends of the electrode terminals 81e and 81f of the packaging substrate 80, for example, thereby reducing the possibility of short-circuit between adjacent electrode terminals due to the solders 110a and 110b.

Further, by limiting the overhanging amount of the solders 110a and 110b from the ends of the electrode terminals 81e and 81f of the packaging substrate 80, it is possible to further reduce the pitch between the electrode terminals 81a to 81f shown in FIG. 5. This allows size reduction in an electric equipment to mount the packaging substrate 80, for example.

Though the first and second embodiments of the invention described above use solder as flowable conducting material, the present invention is not limited thereto and the same effect can be obtained when using silver paste or the like instead.

Further, non-conducting material such as adhesive may be used as long as it is flowable. In this case, it is possible to prevent adjacent electrode terminals from being connected to each other due to adhesive and thereby reduce deterioration in electrical characteristics.

Although the second embodiment uses a resistor as an electronic component, it is not limited thereto, and a chip component such as a transistor, capacitor and inductor may be used instead. It is also applicable to a passive circuit component and a semiconductor device such as transistor and IC.

Furthermore, though the grooves 811a to 811f formed in the electronic terminals 81a to 81f are circular in the second embodiment described above, they may be polygonal.

Though the high frequency device boards 10 and 70 and the packaging substrate 50 are single-layer double-sided boards in the first and second embodiments, it is also applicable to a multi-layer board.

In the first embodiment, the grooves for accumulating solder are formed in the ground electrode terminals 11 and 71 on the rear surface of the high frequency device board 10 and 70, respectively. However, the grooves for accumulating solder may be formed in the ground electrode terminal 51 on the surface of the packaging substrate 50.

It is apparent that the present invention is not limited to the above embodiment that may be modified and changed without departing from the scope and spirit of the invention.

What is claimed is:

1. An electronic circuit board including an electrical component mounted on a front surface, comprising:
a plurality of electrode terminals formed on a rear surface of the electronic circuit board and connected to one of an electronic component and another electronic circuit board by using flowable conducting material, the plurality of electrode terminals comprising a ground electrode terminal formed in a center of the rear surface of the electronic circuit board for connecting to a ground; and
a groove formed within the ground electrode terminal of the plurality of electrode terminals to accumulate the flowable material,
wherein a bottom surface of the groove comprises an insulating material.

2. The electronic circuit board according to claim 1, wherein the groove is one of slit-shaped, circular-shaped, and polygonal-shaped.

3. The electronic circuit board according to claim 1, wherein the groove is formed in the electrode terminal by etching.

4. The electronic circuit board according to claim 1, wherein the groove is disposed in the electrode terminal in proximate to other electrode terminals placed adjacent to each other.

5. The electronic circuit board according to claim 1, wherein said groove comprises a width of approximately 0.1 mm and a depth of between 0.03 mm to 0.06 mm.

6. The electronic circuit board according to claim 1, wherein a distance between the electrode terminal having said groove and an other electrode of the plurality of electrode terminals is between 0.1 mm to 0.2 mm.

7. The electronic circuit board according to claim 1, wherein the electrode terminal having the groove formed within is disposed on a rear surface of the electronic circuit board.

8. An electronic circuit board where a high frequency component is mounted on a front surface, comprising:
a plurality of electrode terminals formed on a rear surface of the electronic circuit board and connected to another electronic circuit board by a flowable conducting material, the plurality of electrode terminals including a ground electrode terminal formed in a center of the rear surface of the electronic circuit board and connected to a ground; and
a groove formed within the ground electrode terminal to accumulate the flowable material,
wherein a bottom surface of the groove comprises an insulating material.

9. The electronic circuit board according to claim 8, wherein a rest of the plurality of electrode terminals different from the ground electrode terminal are formed in an end part of the electronic circuit board, and
the groove is disposed in the ground electrode terminal in proximate to the rest of the plurality of electrode terminals.

10. The electronic circuit board according to claim 8, wherein said groove comprises a plurality of grooves being formed within the ground electrode terminal to accumulate the flowable material.

11. The electronic circuit board according to claim 8, wherein said groove comprises a width of approximately 0.1 mm and a depth of between 0.03 mm to 0.06 mm.

12. The electronic circuit board according to claim 5, wherein a distance between the ground electrode terminal having the groove arid an other electrode of the plurality of electrode terminals is between 0.1 mm to 0.2 mm.

* * * * *